United States Patent
Hsu et al.

(10) Patent No.: US 9,558,944 B2
(45) Date of Patent: Jan. 31, 2017

(54) SYSTEM, METHOD AND RETICLE FOR IMPROVED PATTERN QUALITY IN EXTREME ULTRAVIOLET (EUV) LITHOGRAPHY AND METHOD FOR FORMING THE RETICLE

(71) Applicant: TAIWAN SEMICONDUCTOR MANUFACTURING CO., LTD., Hsin-Chu (TW)

(72) Inventors: Chia-Hao Hsu, Hsinchu (TW); Chia-Chen Chen, Hsinchu (TW); Jui-Ching Wu, Hsinchu (TW); Shang-Chieh Chien, New Taipei (TW); Chia-Jen Chen, Jhudong Township (TW); Chia-Ching Huang, Su-ao Township (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 63 days.

(21) Appl. No.: 14/716,917

(22) Filed: May 20, 2015

(65) Prior Publication Data
US 2015/0255272 A1    Sep. 10, 2015

Related U.S. Application Data

(63) Continuation of application No. 13/758,114, filed on Feb. 4, 2013, now Pat. No. 9,046,776.

(51) Int. Cl.
G03F 1/22 (2012.01)
G03F 1/54 (2012.01)
H01L 21/027 (2006.01)
G03F 1/00 (2012.01)
G03F 7/20 (2006.01)

(52) U.S. Cl.
CPC ............. *H01L 21/0274* (2013.01); *G03F 1/14* (2013.01); *G03F 1/22* (2013.01); *G03F 7/70283* (2013.01)

(58) Field of Classification Search
CPC ................. G03F 1/24; G03F 1/22; G03F 1/54
See application file for complete search history.

(56) References Cited

U.S. PATENT DOCUMENTS

| | | | |
|---|---|---|---|
| 6,872,495 | B2 | 3/2005 | Schwarzl |
| 8,691,476 | B2 | 4/2014 | Yu et al. |
| 2004/0126670 | A1 | 7/2004 | Liang et al. |
| 2013/0196256 | A1 | 8/2013 | Ryu et al. |

OTHER PUBLICATIONS

Van Setten, E. et al., "EUV mask stack optimization for enhanced imaging performance", Proc. SPIE 7823, Photomask Technology, 2010, 7828, 12 pages.
Hendrickx, E. et al., "Accurate models for EUV lithography", Proc. SPIE 7488, Photomask Technology, Sep. 2009, 74882G, 10 pages.

*Primary Examiner* — Stephen Rosasco
(74) *Attorney, Agent, or Firm* — Duane Morris LLP

(57) ABSTRACT

A reticle for use in an extreme ultraviolet (euv) lithography tool includes a trench formed in the opaque border formed around the image field of the reticle. The trench is coated with an absorber material. The reticle is used in an euv lithography tool in conjunction with a reticle mask and the positioning of the reticle mask and the presence of the trench combine to prevent any divergent beams of radiation from reaching any undesired areas on the substrate being patterned. In this manner, only the exposure field of the substrate is exposed to the euv radiation. Pattern integrity in neighboring fields is maintained.

20 Claims, 4 Drawing Sheets

SYSTEM, METHOD AND RETICLE FOR IMPROVED PATTERN QUALITY IN EXTREME ULTRAVIOLET (EUV) LITHOGRAPHY AND METHOD FOR FORMING THE RETICLE

CROSS-REFERENCE TO RELATED APPLICATIONS

This application is a continuation of U.S. patent application Ser. No. 13/758,114, filed on Feb. 4, 2013, the contents of which is hereby incorporated by reference as if set forth in its entirety.

TECHNICAL FIELD

The disclosure relates to systems and methods for patterning semiconductor devices using extreme ultraviolet ("euv") lithography. More particularly, the disclosure relates to a system, method and reticle mask used in euv lithography.

BACKGROUND

Extreme ultraviolet, euv, technology is a rapidly advancing lithography technology for patterning semiconductor and other devices. Euv lithography uses an extreme ultraviolet, euv, wavelength of radiation generally at about 13.5 nm. Euv lithography enables the creation of more accurate patterns with better resolution and smaller feature sizes. Euv lithography operations utilize reflective optics, including a reflective mask, also referred to as a reticle.

Reflective surfaces are used, instead of lenses, to guide the euv light beams from the euv light source to the reticle, because all matter absorbs euv radiation and glass lenses would immediately absorb euv photons.

The reticle used in euv lithography is a complex optical element with many parameters that affect the critical dimensions and precision of the features formed on the substrate. The reticle contains a reflecting multilayer that may be tuned to the wavelength of light used, and an absorber which defines the dark areas. A pattern of the reflective multilayer and absorber is formed on the reticle and this pattern is transferred to the substrate being patterned as the euv light radiation reflects off of the reticle. The euv light beam is incident upon the reticle at an oblique angle and reflects off of the reticle to reach the substrate. The euv light beams that reflect from the reticle should ideally have the same angle with respect to the reticle as the incident euv light beam. When there is a variance in the angle of the reflected euv light beam, this divergent, off-axis illumination is referred to as "flare." Flare in EUV systems can be caused by surface roughness in the reflective surface which causes incident light to be scattered in multiple directions in addition to the specular direction.

The euv light beams that are reflected from the reticle and impinge upon the substrate surface chemically alter the exposed photoresist. The euv beam that reflects off of the reticle is scanned across the substrate to form patterns on the individual integrated circuits, i.e. die, of the substrate. A number of scans of the euv light beams are used to pattern the entire substrate. The portion of the pattern being scanned onto the substrate is known as the scanning field. A number of scanning fields are used to pattern the complete substrate. When a patterning operation is being carried out in one scanning field, it is critical that other portions of the substrate outside the present scanning field, are not subject to light reflected off of the reticle. Non-telecentric optics, imperfect absorber or reflective layers on the reticle and other conditions can result in flare and cause the euv radiation to be undesirably reflected onto neighboring fields not desired to be exposed. When such light is reflected outside the scanning field, this divergent light introduces patterning distortions and can alter or destroy features outside of the scanning field. The light that reaches areas outside the scanning field causes patterning problems such as CD (critical dimension) variation of device features on regions of the substrate that neighbor the field being scanned. This scattered light in the projection optics could result in several nanometers of on-wafer dimensional variation, if left uncorrected.

It would be desirable to reduce the divergent radiation associated with euv patterning.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides a reticle used in a lithography apparatus for uv or euv patterning operations. The disclosure also provides a method for forming the reticle. The disclosure also provides for carrying out a lithography operation using the reticle. Although the disclosure is described with respect to an euv lithography system, aspects of the disclosure are also applicable to other ultraviolet lithography systems.

Figure 1:
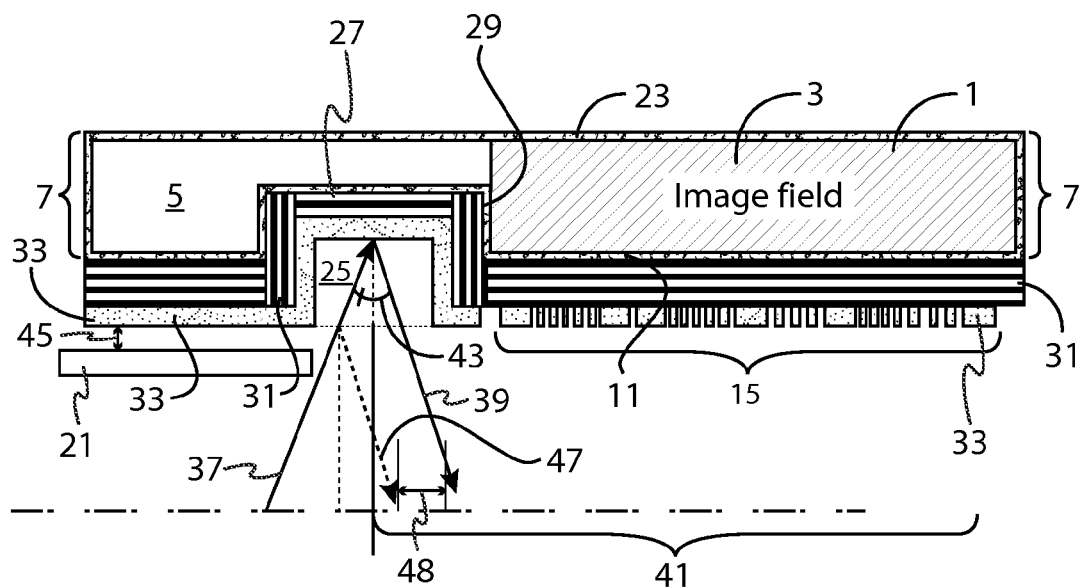
FIG. 1 is a cross-sectional side view of an embodiment of a reticle including a trench, according to the disclosure.

FIG. 1 shows reticle 1 and reticle mask 21. Reticle 1 is a reticle used in an euv lithography apparatus for patterning a substrate also positioned in the lithography apparatus. Reticle 1 includes two sections: image field 3 and opaque border 5. Image field 3 includes pattern 15 that will be projected onto a substrate. Reticle 1 is formed of a base material 7. Both opaque border 5 and image field 3 are formed of base material 7.

Figure 2:
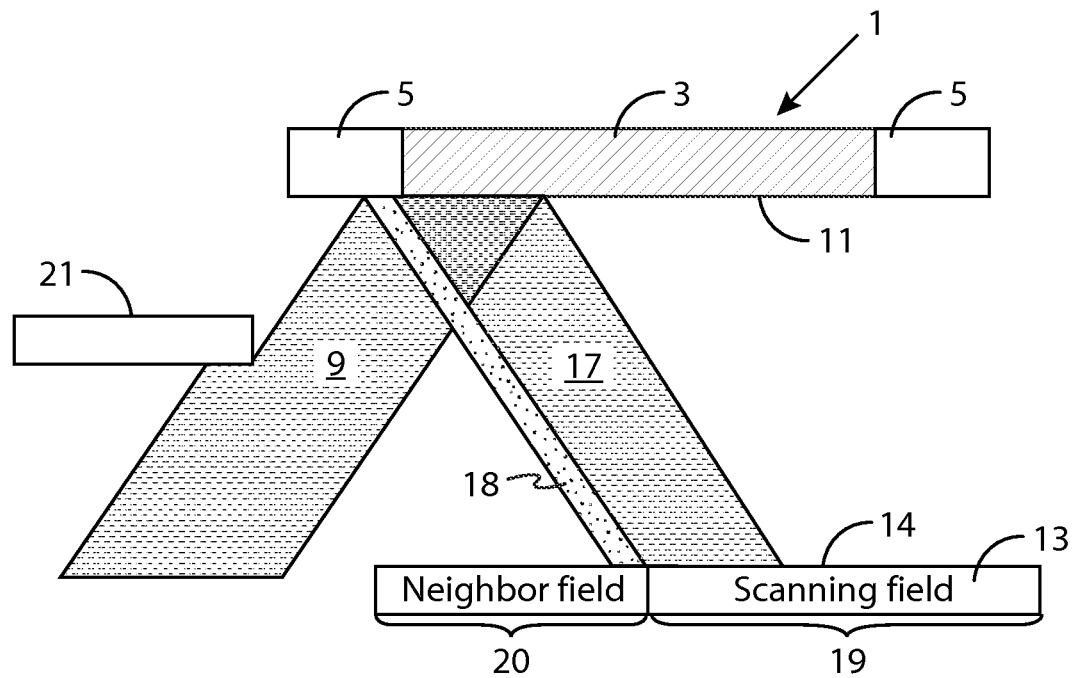
FIG. 2 shows an exemplary arrangement of portions of an euv apparatus according to the disclosure.

Now turning to FIG. 2, components within an euv lithography apparatus are shown. It can be seen that opaque border 5 surrounds image field 3 on reticle 1 shown in cross-section. An euv light source within an euv lithography apparatus provides euv light beam 9 which is incident upon pattern side 11 of reticle 1 and is reflected as reflected beam 17 directed toward wafer 13. Various sources of euv light generation are used to produce euv light beam 9 in various embodiments. Euv light is emitted by electrons that are bound to multicharged positive ions. The multicharged positive ions are produced in hot, dense plasmas in some embodiments. Xe or Sn plasma sources are used for euv lithography in some embodiments but other sources of euv radiation are used in other embodiments. The euv radiation is produced at various wavelengths and is about 13.5 nm in one embodiment.

Wafer 13 and reticle 1 are parallel to one another and in confronting relation. Wafer 13 is received on a stage (not shown) of the euv lithography apparatus. Wafer 13 will have been coated with a photoresist on surface 14 when undergoing the patterning operation. Reflected beam 17 forms a pattern in scanning field 19 of wafer 13 and the arrangement of the disclosure prevents portions of reflected beam 11 from reaching neighbor field portion 20 of wafer 13. One aspect of the disclosure is the use of reticle mask 21 to block portions of euv light beam 9 from reaching pattern side 11 of reticle 1. Reticle mask 21 is placed between the radiation source and reticle 1 in an attempt to prevent radiation such as euv light beam 9 from reflecting off of reticle 1 onto undesired areas on wafer 13. The accurate placement of reticle mask 1 in the x- and y-directions with respect to euv light beam 9 and reticle 1 and also the x- and y-position of reticle mask 21 with respect to opaque border 5 around image field 3 formed on reticle 1, is critical. Blocked beam portion 18 represents the location where a reflected beam would exist if not blocked by reticle mask 21. As will be described, trench 25 further prevents divergent light beams from reaching neighbor field 20. In the full-field scanning embodiment, scanning field 19 is the width of an entire die, but scanning field 19 includes multiple die or portions of a die, in other embodiments. The pattern of the reticle is reduced by a factor of 4:1 as produced on wafer 13 in one embodiment but other reduction factors are used in other embodiments.

Returning to FIG. 1, pattern 15 is formed on pattern side 11 of reticle 1, which is disposed opposite back side 23 of reticle 1. Base material 7 is formed of a material having a low coefficient of thermal expansion. A "low" coefficient of thermal expansion (CTE) is known and understood to be a CTE less than about 0±5 ppb/K. In various embodiments, glass, $TiO_3$ and other suitable materials are used for base material 7. In some embodiments, base material 7 has an ultra low expansion coefficient (ULE) less than about 0±5 ppb/K. Trench 25 is formed within base material 7 of reticle 1 and extends inwardly from pattern side 11 of reticle 1. Trench 25 is formed at or near the interface of opaque border 5 and image field 3 of reticle 1. Trench 25 is bounded by bottom surface 27 and sides 29. In the illustrated embodiment, one of the sides 29 of trench 25 forms an edge of image field 3, but in other embodiments, trench 25 is located at other locations at or near the interface between opaque border 5 and image field 3. Multilayer reflective material 31 is formed on pattern side 11 of reticle 1 in image field 3 portion and also in opaque border 5 portion. Multilayer reflective material 31 is formed on bottom 27 and sides 29 of trench 25. Various materials are used for multilayer reflective material 31 and in some embodiments, molybdenum and silicon are used. In other embodiments, molybdenum, silicon and rubidium are used. Multilayer reflective material 31 is chosen to include a high reflectivity and the reflectivity varies from about 50% to about 90% in some embodiments.

Absorber layer 33 is formed over multilayer reflective material 31. Absorber material 33 is a tantalum-boron-nitride composition in one embodiment, but other suitable absorber materials are used in other embodiments. Absorber layer 33 and multilayer reflective material 31 form pattern 15 on pattern side 11 in image field 3 portion of reticle 1. Absorber layer 33 is dark and reflects only a very small portion of the incident light beam onto the substrate being patterned, but light beams that impinge upon multilayer reflective material 31 are reflected to the substrate. It should also be noted that the thickness of absorber layer 33 is expanded for clarity in FIG. 1.

Light beam 37 is incident on pattern side 11 of reticle 1 and even though absorber layer 33 is chosen to be minimally reflective, a portion of light beam 37 reflects as reflected beam 39 due to the high energy of the euv radiation. Reticle mask 21 is positioned to block light beams to the left of light beam 37 and which would fall outside of scan field 41, i.e. to the left of scan field 41 in the illustrated embodiment. Distance 45 and the lateral position of reticle mask 21 is determined in conjunction with the incident angle of light beam 37, which is one of half of angle 43 between incident light beam 37 and reflective light beam 39. In some embodiments, distance 45 is about 5-15 mm, but other locations are used in other embodiments. Reflected light beam 39 reflects off bottom surface 27 of trench 25 and is disposed further to the right than a reflected beam would be in the absence of trench 25. Dashed line 47 indicates the location of a beam that would be reflected from light beam 37, if trench 25 was not present and also shows that reflected light beam 39 produced as a result of trench 25, is directed further into scan field 41 by distance 48, the therefore further distanced from being outside scan field 41. Further details of the dimensions of trench 25 are shown in FIG. 3.

Figure 3:
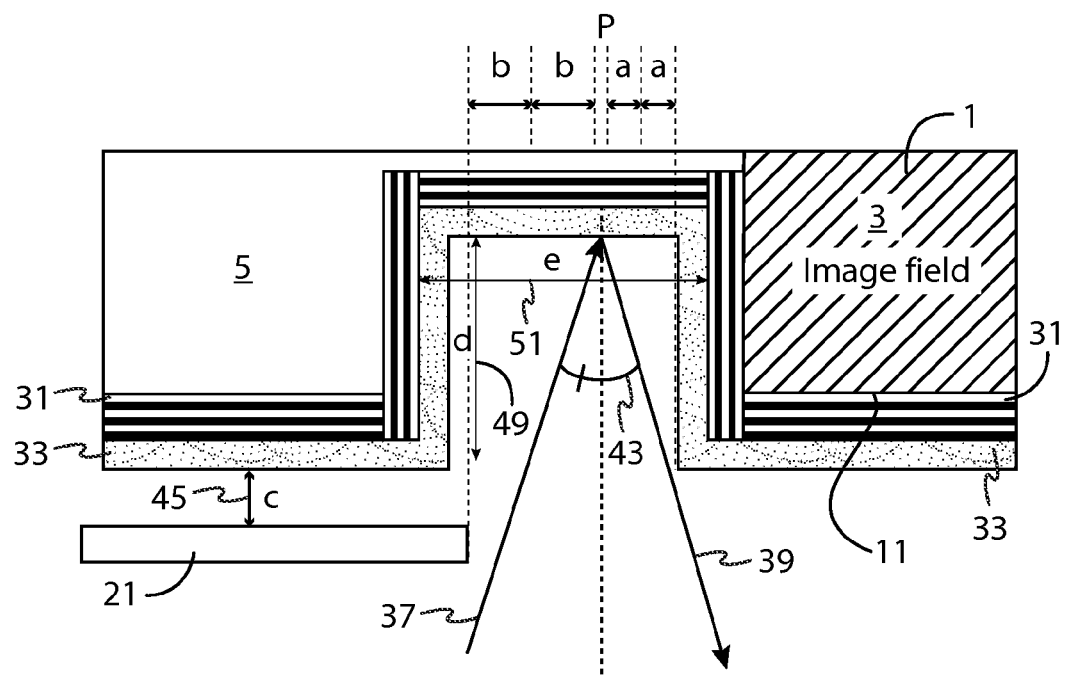
FIG. 3 shows further details of a trench formed in a reticle according to an embodiment of the disclosure.

FIG. 3 shows trench 25 with sides 29 and bottom 27. The dimensions, including depth 49 and width 51, of trench 25 vary in various embodiments. In some embodiments, depth 49 is 60-75% of thickness 55 of reticle 1 and may be 50%-85% of thickness 55 of reticle 1 in some embodiments. In one embodiment, depth 49 is at least about 65% of thickness 55 of reticle 1. Reticle 1 includes a thickness 55 of about 6 mm in some embodiments and about 5-10 mm in other embodiments but other thicknesses are used in still other embodiments. Various design factors are taken into account and used to calculate depth 49 and width 51 in various embodiments. In some embodiments, an alignment tolerance/accuracy for the placement of reticle 1 and an alignment tolerance/accuracy for placement of reticle mask 21 in a photolithography manufacturing apparatus, are determined. The tolerances are based on the accuracy of the positioning tools and measurement systems used to measure the positions of reticle 1 and parallel reticle mask 21 in a manufacturing tool. Angle 43 represents the angle between incident light beam 37 and reflected light beam 39 and ranges from about 4-15° in various embodiments.

In one embodiment, the dimensions of depth, d and width, e, bear the following relationship to other features:

$$(c+d) \times \tan F° \geq (a+b)$$

$$e \geq 2(a+b)$$

In the preceding equations, "a" represents the reticle position accuracy, "b" represents the reticle mask position accuracy, "c" represents distance 45 between the reticle mask 21 and reticle 1, "d" represents depth 49 of trench 25, "e" represents width 51 of trench 25, and angle "F" represents angle 43. The relationship of the preceding equations are useful for determining the dimensions "d" and "e" of trench 25 and are also useful for positioning the reticle mask 21 at the correct spacing "c" from reticle 1. The preceding equations provide one embodiment for determining depth 49 and width 51 of trench 25 based on one set of parameters, but other techniques for calculating desirable dimensions of width 51 and depth 49 of trench 25 are used in other embodiments. In still other embodiments, depth 49 and width 51 are determined using other factors.

Figure 4A:
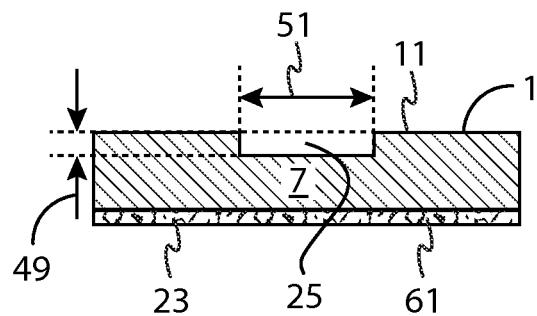
FIGS. 4A-4C are cross-sectional views that show a sequence of processing operations used to form a reticle according to an embodiment of the disclosure.
Figure 4B:
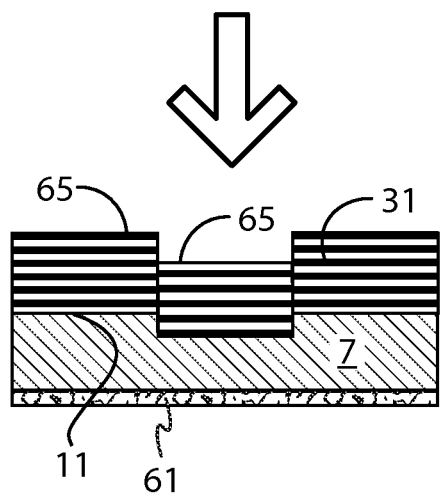

FIG. 4A shows a portion of reticle 1. Base material 7 includes pattern side 11 and back side 23. Layer 61 is formed on back side 23 of reticle 1 and layer 61 is CrN in one embodiment, but other suitable materials are used on back side 23 as a backing material in other embodiments. Trench 25 is formed to extend downwardly from pattern side 11 and into base material 7. Trench 25 is formed to depth 49 and width 51. Various etching techniques are available and are used to form trench 25. FIG. 4B shows multilayer reflective material 31 formed on pattern side 11 of reticle 1, including within trench 25 that was shown more clearly in FIG. 4A. Various deposition methods and epitaxial formation methods are used to form multilayer reflective material 31 in various embodiments. Molybdenum and silicon are used for multilayer reflective material 31 and in various embodiments several alternating layers of molybdenum and silicon are used. Other combinations of molybdenum and silicon are used in other embodiments. In some embodiments, rubidium is formed on surface 65 of multilayer reflective material 31, but this is not shown in the embodiment of FIG. 4B. Multilayer reflective material 31 includes a total thickness of about 40-400 nm in some embodiments, but other thicknesses are used in other embodiments. In some embodiments, multilayer reflective material 31 is formed of a repeating sequence of a 4 nm molybdenum layer and a 3 nm silicon layer and in one embodiment 40 pairs of these layers are used with an aggregate thickness of about 280 nm, but other material layers and thicknesses are used to form multilayer layers reflective material 31 in other embodiments.

Figure 4C:
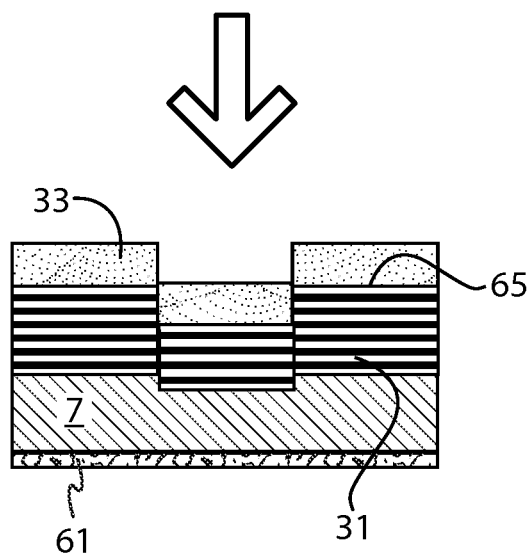

In FIG. 4C, absorber material 33 is formed on pattern side 11 of reticle 1 and, in particular, on multilayer reflective material 31, including within trench 25. Various formation methods and epitaxial formation methods are used to form absorber layer 33 in various embodiments. In some embodiments, absorber layer 33 is formed of tantalum boron nitride. In other embodiments, absorber layer 33 is formed of non-stoichiometric compositions of tantalum, boron, and nitrogen. Other suitable materials are used for absorber layer 33 in other embodiments. Absorber layer 33 includes a thickness of about 40-80 nm in some embodiments, but other thicknesses are used in other embodiments.

Another aspect of the disclosure is the use of reticle 1 such as shown with trench 25 in FIG. 1, in an euv lithography tool in an arrangement such as shown in FIG. 2, in which reticle 1 and wafer 13 are in confronting relation and parallel, and reticle mask 21 is positioned with respect to reticle 1 to prevent undesired light from reflecting onto areas other than scanning field 19. Applicants have found that, as a result of the accurate placement of reticle mask 21 and the use of trench 25, divergent light is reduced and the euv light radiation that reflects off of reticle 1 is directed to the scanning field 19 and not neighbor field 20.

According to an aspect of the disclosure, a reticle for patterning a semiconductor device in an extreme ultraviolet (euv) lithography tool, is provided. The reticle comprises a reticle substrate having an image field and an opaque border at least partially surrounding the image field; the reticle substrate including a pattern side and an opposed back side and formed of a base material having a low coefficient of thermal expansion and including a trench formed in the base material in the opaque border or at an interface between the image field and the opaque border, the trench extending inwardly from the pattern side and lined with an absorber material.

According to an aspect of the disclosure, a method for forming a reticle used for patterning a semiconductor device using an extreme ultraviolet (EUV) lithography tool, is provided. The method comprises: providing a reticle substrate formed of a base material being a material having a coefficient of thermal expansion less than 0±5 ppb/K, the reticle substrate including a central image field and an opaque border at least partially surrounding the central image field; etching a trench into the base material in the opaque border or at an interface between the image field and the opaque border; forming a multilevel reflective structure of molybdenum and silicon on the reticle substrate, including on sides and a bottom of the trench; and, forming an absorber material over the multilayer reflective material.

According to another aspect of the disclosure, a method for patterning a semiconductor device in an extreme ultraviolet (euv) lithography apparatus, is provided. The method comprises: providing an extreme ultraviolet (euv) lithography apparatus with an euv radiation source; providing a substrate to be patterned on a stage in the euv lithography apparatus, the substrate coated with photoresist; positioning a reticle in confronting relation with the coated substrate; and directing a light beam from the euv radiation source, to a pattern side of the reticle at an oblique angle such that the light beam reflects off the reticle and onto the coated substrate. The reticle includes the pattern side and an opposed back side, is formed of a base material having a low coefficient of thermal expansion and includes a trench formed in the base material in the opaque border or at an interface between an image field and an opaque border of the reticle. The trench extends inwardly from the pattern side and is lined with an absorber material.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for patterning a semiconductor device in an extreme ultraviolet (EUV) lithography apparatus, said method comprising:
    providing an EUV lithography apparatus with an EUV radiation source;
    providing a substrate to be patterned, on a stage in said EUV lithography apparatus, said substrate coated with photoresist;
    positioning a reticle having a pattern side in confronting relation with said coated substrate; and
    directing a light beam from said EUV radiation source, to said pattern side at an oblique angle such that said light beam reflects off said reticle and onto said coated semiconductor substrate coated with photoresist,
    wherein said reticle includes a back side opposite the patterned side and includes a base material having a trench formed in said base material at an interface between an image field and an opaque border of said reticle or in said opaque border, said trench extending inwardly from said pattern side and having an absorber material along sidewalls and a bottom of said trench.

2. The method as in claim 1, further comprising positioning a reticle mask between said light beam and said reticle and parallel to said reticle such that a portion of said light beam is blocked by said reticle mask.

3. The method as in claim 2, wherein said trench has a depth that is at least about 65% of a thickness of said base material, and a width, and wherein a positioning accuracy of the reticle mask is less than or equal to half said width less a positioning accuracy of the reticle.

4. The method as in claim 2, wherein said trench has a width and wherein said positioning a reticle is performed with a reticle positioning accuracy less than or equal to half said width less a positional accuracy of the reticle mask.

5. The method as in claim 4, wherein said reticle mask is spaced a distance c from said reticle, a reflected light beam reflected off of said reticle is separated from said light beam by an angle f°, and said trench has a depth d, wherein a positioning accuracy a of said reticle and a positioning accuracy b of said reticle mask is defined by: $(c+d)\tan f° \geq (a+b)$.

6. The method as in claim 5, wherein said distance c is between 5 mm and 15 mm.

7. The method as in claim 5, wherein said angle f is between 4° and 15°.

8. The method as in claim 1, wherein said reticle further comprises a multilayer reflective material disposed on said pattern side beneath said absorber material in said trench and in an image field of said reticle, said image field including a pattern formed of said absorber material and said multilayer reflective material.

9. A reticle for patterning a semiconductor device in an extreme ultraviolet (EUV) lithography tool, said reticle comprising:
    a reticle for patterning a semiconductor device, said reticle comprising:
    a base material having a pattern side and an opposed back side having an image field and an opaque border region at least partially surrounding said image field;
    a multilayer reflective material disposed over said image field; and
    an absorber layer formed over said image field and said opaque border region, said absorber layer and said multilayer reflective material defining a reflective pattern within said imaging field.

10. The reticle as in claim 9, comprising a reticle mask positioned to block at least a portion of an EUV light beam directed at said reticle.

11. The reticle as in claim 10, wherein said reticle mask prevents EUV light from reflecting onto a plurality of areas of a wafer.

12. The reticle as in claim 9, comprising a trench formed in said base material.

13. The reticle as in claim 12, wherein said trench is disposed within said opaque border region.

14. The reticle as in claim 12, wherein said trench is disposed at an interface between said image field and said opaque border region.

15. The reticle as in claim 12, wherein said multilayer reflective material is disposed over sidewalls and a bottom surface of said trench.

16. A method for patterning a semiconductor device in an extreme ultraviolet (EUV) lithography apparatus, said method comprising:
    providing an extreme ultraviolet (EUV) lithography apparatus with an EUV radiation source;
    providing a substrate to be patterned, on a stage in said EUV lithography apparatus, said substrate coated with photoresist;
    positioning a reticle having a pattern side in confronting relation with said coated substrate and a back side opposite the pattern side, said pattern side having an image field and an opaque border at least partially surrounding said image field;
    positioning a reticle mask between said reticle and said EUV radiation source; and
    directing a light beam from said EUV radiation source, to said pattern side at an oblique angle such that said light beam reflects off said reticle and onto said coated semiconductor substrate coated with photoresist, wherein said reticle mask prevents a portion of said light beam from striking said reticle.

17. The method as in claim 16, wherein said reticle has a trench formed in said pattern side, wherein said trench is formed at an interface between said image field and said opaque border of said reticle or in said opaque border.

18. The method as in claim 17, wherein said trench extends inwardly from said pattern side and has an absorber material formed along sidewalls and a bottom of said trench.

19. The method as in claim 16, wherein said reticle has a multilayer reflective surface formed on said pattern side prior to directing said light beam at said reticle.

20. The method as in claim 19, wherein said reticle has an absorber layer formed over a portion of said multilayer reflective surface, wherein said absorber layer and said multilayer reflective surface define an image field, said image field has an opaque border.

* * * * *